(12) United States Patent
Shimonaka

(10) Patent No.: US 7,053,539 B2
(45) Date of Patent: May 30, 2006

(54) LAMP DEVICE

(75) Inventor: Masatoshi Shimonaka, Himeji (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 177 days.

(21) Appl. No.: 10/819,310

(22) Filed: Apr. 7, 2004

(65) Prior Publication Data

US 2004/0201342 A1 Oct. 14, 2004

(30) Foreign Application Priority Data

Apr. 8, 2003 (JP) .............................. 2003-103569

(51) Int. Cl.
*H01J 5/48* (2006.01)
(52) U.S. Cl. .............................. 313/318.01; 313/318.08
(58) Field of Classification Search ........... 313/318.01, 313/318.02, 318.07–318.09, 318.12
See application file for complete search history.

(56) References Cited

FOREIGN PATENT DOCUMENTS

| JP | 03-2920 Y2 | 1/1991 |
| JP | 03-206484 A | 9/1991 |
| JP | 2579042 Y2 | 5/1998 |
| JP | 2001-210280 A | 8/2001 |

*Primary Examiner*—Vip Patel
(74) *Attorney, Agent, or Firm*—Rader, Fishman & Grauer PLLC

(57) ABSTRACT

A lamp device comprising a plurality of lamps which are arranged in parallel to each other, each of the lamps has a glass bulb wherein a pinch seal portion is formed at each end of the glass bulb, an external lead rod extends from the pinch seal portion, and the external lead rod is connected to a feeding member bases which connect the plurality of lamps at both ends of the lamp, wherein each of the bases has a through hole in which the pinch seal portion and the feeding member are inserted, and the feeding member is pulled out from an end face of each of the bases, wherein both ends of only one of the lamps are fixed to the bases respectively.

11 Claims, 3 Drawing Sheets

LAMP DEVICE

TECHNICAL FIELD OF THE INVENTION

The present invention relates to a lamp device which is disposed as a heat source in a heating roller of a heat-fixing apparatus in, for example, an electrophotographic copying machine, a laser printer, a facsimile machine and the like.

DESCRIPTION OF RELATED ART

For example, in an electrophotographic copying machine etc., a heating roller system is widely used. In such as a heating roller system, a unfixed toner image is formed on a recording paper sheet, and fixed thereon by passing the recording paper sheet between a heating roller and a pressing roller which is placed opposite to and in contact with the heating roller, so as to heat the unfixed toner image under pressure.

As the heating roller used for the heating roller system, a rod-shaped lamp (or cylindrical lamp) disposed in the body of a roller as a heat source is known.

In such a heating roller, in order to heat a recording paper sheet in different size entirely at a uniform and sufficiently high temperature, two or more light emitting patterns or two or more lamps having the same specification are used.

Specifically, in view of the limitation to space for installing a lamp in the body of the roller, and complexity of installing multiple lamps one by one, a lamp device in which two or more lamps are connected and arranged in parallel to each other is used The conventional technology is described with reference to FIG. 5.

FIG. 5 shows a cross sectional view of a lamp device taken along a tube axis as an example of the conventional technology.

Two lamps 80 arranged in parallel to each other are disposed in the lamp device, and a base 90 which connects these lamps 80 to each other at one end of each lamp 80 is provided.

In the base 90, two recesses 91 are formed in the inner end face on the lamp 80 side. A flat pinch seal portion 82 disposed on an end of a glass bulb 81 of each lamp 80 is accommodated in the respective recesses 91, and is fixed in such a state in the respective recesses 91 by, for example, binding agent S made of inorganic material.

Small through-holes 92 connecting an external end face of the base 90 to the respective recesses 91 are provided in the bases 90 respectively. Each of lead wires 85 is pulled out from the through hole 92 and connected to an external lead rod 83 of each lamp 80 through a connecting terminal 84 in the through hole 92.

The above-mentioned lamp device has the following problems:

(1) As described in Japanese Examined Utility Model Patent No. 3-2920, a light emission area of a filament, the amount of light emission, light emitting time etc. of individual lamps may vary depending on the width of a recording paper sheet.

In such a lamp device, the temperature of the glass bulbs of the individual lamps often varies depending on the use condition, and, in such a case, the difference of thermal expansion degree between the glass bulbs will arise.

As a result, in one of the glass bulbs, a large degree of expansion occurs, and in another glass bulb, a small degree of expansion occurs, so that the expansion amounts differ from each other. Since, in the former case, the glass bulb is squeezed by the base, and, in the later case, the glass bulb is stretched, so that strain occurs in each bulb thereby destroying the glass bulbs.

Also since the shearing stresses is produced along the boundary face between the pinch seal portion of the glass bulb and the binding material, the pinch seal portion is sometimes damaged.

Also, there is the following problem:

(2) As mentioned above, when two or more glass bulbs are fixed to the bases, at each side of the glass bulbs, each pinch seal portion is inserted by the predetermined depth in the respective recesses of the bases, and binding agent is filled therebetween. That is, the binding agent filling process is twice performed on each lamp.

The larger the number of the lamps, the larger the number of steps of the process so that the lamp device productivity falls remarkably.

For example, as described in Japanese Laid Open Patent No. 2001-210280, the problem (1) described above may be solved by inserting an end of the pinch seal portion into a hole of the base, and passing an external lead rod through the base thereby connecting it to an end terminal at the end portion of the base.

However, since the step for inserting the pinch seal portion into the base and a step for welding external lead rod to a platy terminal are required twice on each lamp, when the number of the lamps increases, the lamp device productivity remarkably decreases.

That is, the problem (2) as to the complexity of the entire manufacturing process has not been solved.

SUMMARY OF THE INVENTION

In view of the above problems, the present invention is to provide a lamp device in which the body of a roller has lamps therein as a light source.

It is another object of the present invention to prevent breakage of the glass bulbs due to heat expansion of the glass bulbs even in case that the degree of the temperature which the glass bulbs reach varies depending on individual lamps.

It is a further object of the present invention to prevent complexity of the manufacturing process in which the number of steps of the process increases due to the large number of lamps provided in one device.

It is a still further object of the present invention to provide a lamp device capable of maintaining high productivity even if the large number of the lamps are used for one device.

The problem described above is solved by a lamp device comprising a plurality of lamps which are arranged in parallel to each other, each of the lamps has a glass bulb wherein a pinch seal portion is formed at each end of the glass bulb, an external lead rod extends from the pinch seal portion, and the external lead rod is connected to a feeding member, bases which connect the plurality of lamps at both ends of the lamp, wherein each of the bases has a through hole in which the pinch seal portion and the feeding member are inserted, and the feeding member is pulled out from an end face of each of the bases, wherein both ends of only one of the lamps are fixed to the bases respectively.

The only one of the lamps which is fixed to the bases may be a lamp whose glass bulb has the highest heat expansion at an operating time of the lamp device.

The only one of the lamps which may be fixed to the bases is a lamp whose glass bulb has the highest strength among the plurality of lamps.

Further, the problem described above is solved by a lamp device comprising a plurality of lamps, each of the lamps has a glass bulb and a lamp end portion at each end of the glass bulb, and insulated bases which connect the plurality of lamps, wherein both ends of only one of the lamps are fixed to the bases respectively.

The glass bulb may be rod-shaped.

The lamp end portion may comprise a pinch seal portion, an external lead rod, and feeding member, the pinch seal portion being connected to the external lead rod, and the external lead rod being connected to the feeding member.

The pinch seal portion may be inserted in a recess.

A gap may be provided between an end face of the pinch seal portion and a bottom face of the recess.

Each of the bases may have a binding agent injection hole connecting to the recess.

The binding agent injection hole may be connected to only the recess of the only one of lamps which is fixed to the bases.

Furthermore, the object of the present invention is achieved by a heating roller comprising a lamp device having a plurality of lamps, each of the lamps has a glass bulb and a lamp end portion at each end of the glass bulb, and insulated bases which connect the plurality of lamps, wherein both ends of only one of the lamps are fixed to the bases respectively.

The present invention will become more apparent from the following detailed description of the embodiments and examples of the present invention.

DETAILED DESCRIPTION OF THE INVENTION

Description of a lamp device according to the present invention will be given below in detail.

Figure 1:
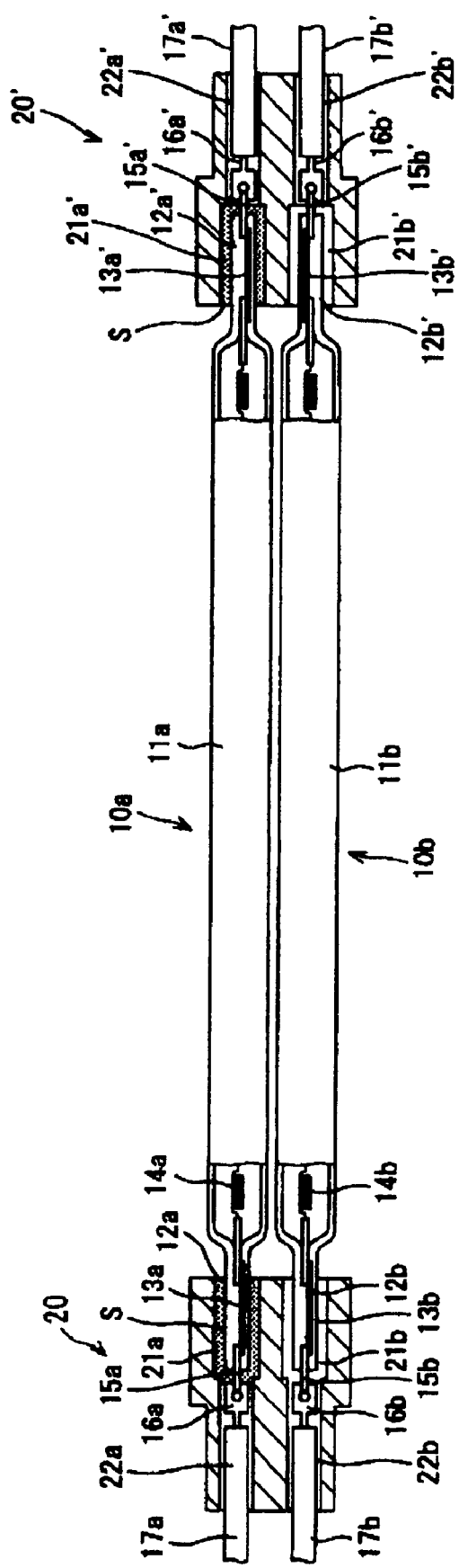
FIG. 1 is a schematic and partial cross-sectional view of a lamp device of an embodiment according to the present invention.

FIG. 1 is a schematic and partial cross-sectional view of the lamp device of an embodiment according to the present invention.

The lamp device comprises two rod-shaped heater lamps 10a and 10b which are arranged in parallel to each other (hereinafter simply referred to as "a lamp" or "lamps"), and approximately cylindrical bases 20 and 20' made of insulating material, which connect these lamps 10a and 10b to each other at both ends.

In particular, the lamps 10a and 10b comprises straight-tube glass bulbs 11a and 11b in which pinch seal portions 12a, 12a', 12b and 12b' are respectively formed at both ends of the lamps 10a and 10b. In the pinch seal portions 12a, 12a', 12b and 12b' respectively formed at the both end of the glass bulbs 11a and 11b, metallic foils 13a, 13a', 13b and 13b' are air-tightly buried so as to be sealed.

In the glass bulbs 11a and 11b, filaments 14a and 14b are disposed respectively along the axial direction of the glass bulbs 11a and 11b. Each end of the filaments 14a and 14b is fixed to an inner end portion of each of the metallic foils 13a, and 13a', 13b, and 13b' by welding etc.

Each of external lead rods 15a, 15a', 15b, and 15b' which extend outside along the axial direct of the glass bulbs 11a and 11b from the pinch seal portions 12a, 12a', 12b, and 12b' is respectively fixed to an external end portion of each of the metallic foils 13a, 13a', 13b, and 13b' by welding etc.

Each of lead wires 17a, 17a', 17b, and 17b' which is coated with insulation film is fixed to respective external terminals of the external lead rods 15a, 15a', 15b and 15b' through respective connecting terminals 16a, 16a', 16b and 16b'.

Approximately rectangular-shaped recesses 21a, 21a', 21b, and 21b' in which the pinch seal portions 12a, 12a', 12b, and 12b' are inserted respectively, are formed on the end face on the lamp side of the bases 20 and 20'. These recesses 21a, 21a', 21b, and 21b' are slightly larger than the respective pinch seal portions 12a, 12a', 12b, and 12b' of the lamps 10a and 10b.

Through holes 22a, 22a', 22b, and 22b' having a larger inner diameter than that of the external lead rods 15a, 15a', 15b, and 15b' and the lead wires 17a, 17a', 17b, and 17b' are provided along the axis direction of the lamps 10a and 10b and connected to the recesses 21a, 21a', 21b, and 21b'.

The external lead rods 15a, 15a', 15b, and 15b' and the lead wires 17a, 17a', 17b, and 17b' are inserted in these through holes 22a, 22a', 22b, and 22b' respectively.

These lead wires 17a, 17a', and 17b and 17b' pass through the through holes 22 and 22', and are connected to back terminals of the bases 20 and 20' respectively.

In this embodiment, the flat pinch seal portions 12a and 12b of the glass bulbs 11a and 11b of the two lamps 10a and 10b are arranged so as to face each other.

Figure 2:
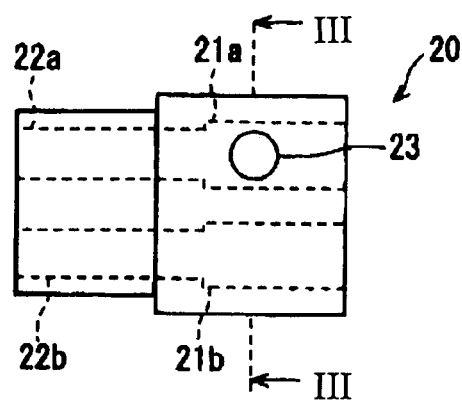
FIG. 2 is a side elevational view of a base.

FIG. 2 is a side elevational view of the base 20.

Figure 3:
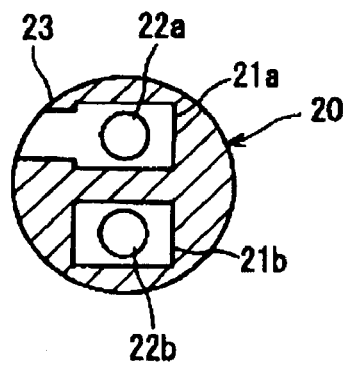
FIG. 3 is a cross sectional view thereof taken along the line III—III shown in FIG. 2.

FIG. 3 is a cross sectional view taken along the line III—III shown in FIG. 2.

As shown in FIGS. 2 and 3, an adhesion agent injection hole 23 corresponding to the recess 21a is formed in the base 20.

No adhesion agent injection hole corresponding to the other recess 21b is formed in the base 20.

Although only one of the bases (20) is shown in the figures, an adhesion agent injection hole corresponding to the recess 21a' is formed in the other base 20' as well.

Description of a method for fixing the lamps and bases will be given with reference to FIGS. 1 and 4.

Figure 4:
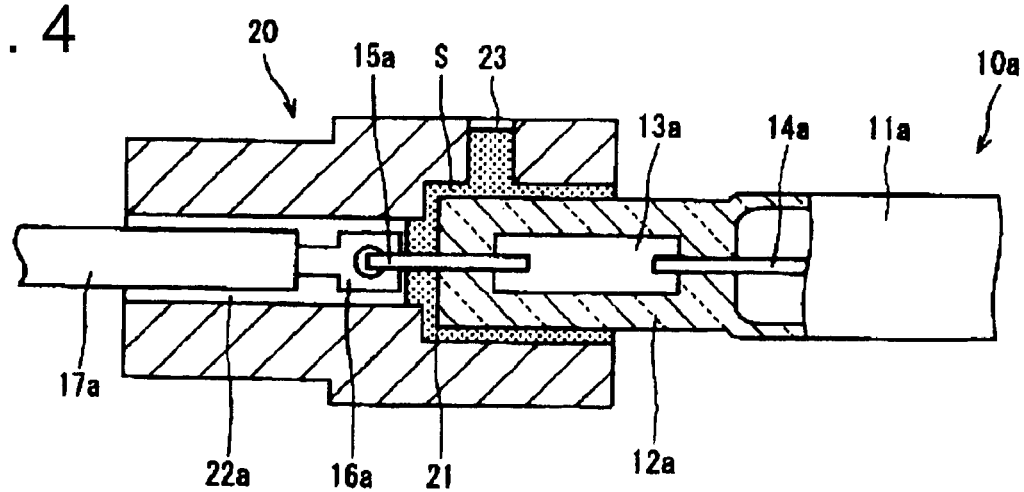
FIG. 4 shows an important part of the lamp, which is fixed to the base, and is a partial sectional view taken along both directions of the metallic foil.
Figure 5:
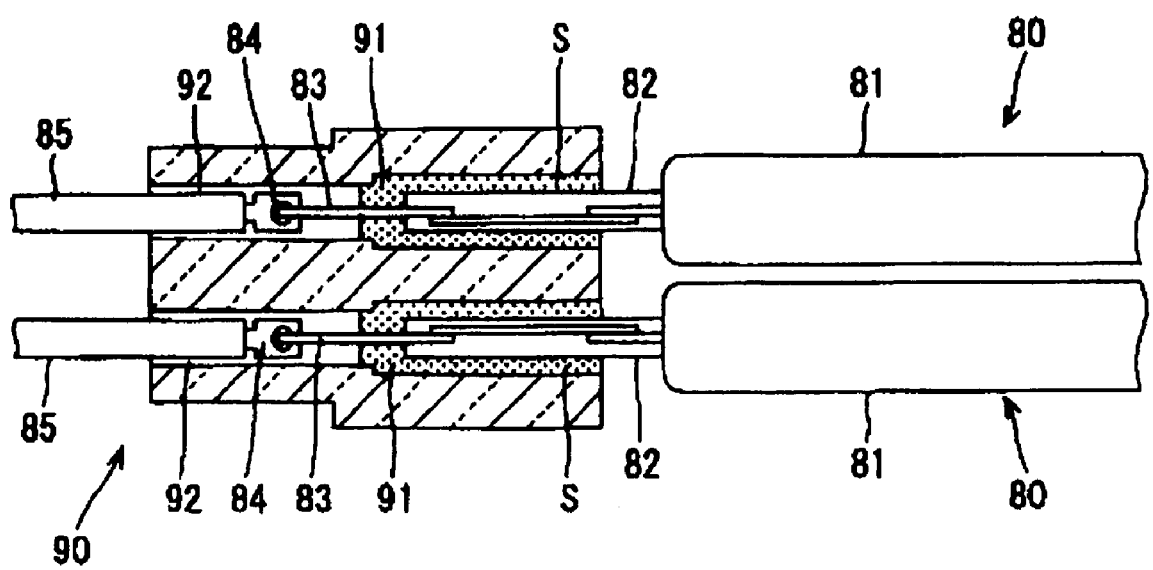
FIG. 5 is a cross sectional view of a conventional lamp device taken along the direction of the tube axis.

FIG. 4 shows an important part of the lamps, in which a lamp is fixed to a base, and is a sectional view taken along both directions of the metallic foil.

As shown in FIGS. 1 and 4, the pinch seal portions 12a, 12a', 12b, and 12b' of the lamps 10a and 10b are inserted in the recesses 21a and 21a' of the bases 20 and 20' respectively.

For only the lamp 10a, the insulating adhesion agent S is injected from the adhesion agent injection hole 23 of the bases 20 and 20' into the recesses 21a and 21a' thereby completing fixation of the bases 20 and 20'.

As described above, the pinch seal portions 12a and 12a' of the lamp 10a are fixed to the recesses 21a and 21a' of the bases 20 and 20' by the adhesion agent S thereby preventing relative movement between the lamp 10a and the bases 20 and 20'.

On the other hand, for the other lamp 10b, the pinch seal portion 12b, and the recesses 21b and 21b' are loosely fit so that they are not fixed on each other.

Since the bases 20 and 20' are fixed to both ends of the lamp 10a respectively so that movement thereof is regulated by the lamp 10a, the distance between the bases 20 and 20' which face each other depends on expansion of the glass bulb 11a comprising the lamp 10a.

On the other hand, although the pinch seal portions 12b and 12b' are fit on the recessions 21 and 21' and the lead wires 17b and 17b' are not fixed since they are just passed through the through holes 22b and 22b', even though the glass bulb 11a of the lamp 10a is expanded by heat, the other lamp 10b is not disengaged from the bases 20 and 20' due to the too large distance between the bases 20 and 20'.

Since the distance between the bases 20 and 20' is at most less than 1 mm in view of the thermal expansion coefficient of glass and the attainment temperature of the lamp and the bulb 11b of the other lamp 10b is also expanded by heat, the lamp 10b and bases 20 and 20' are not disengaged by such difference.

And, since the lamp 10b is held only by fitting with the base 20 and 20', the glass bulb 11b is not regulated by the bases 20 and 20' so that the stress is not applied to the glass bulb 11b.

Since in the lamp device described above, only both ends of the lamp 10a are fixed to the bases 20 and 20' and the other lamp 10b is not fixed to the bases 20 and 20', even if the number of lamps increases, the number of steps of the manufacturing process does not increase thereby reducing the complexity of the manufacturing process.

And since the expansion of the lamp is absorbed in a gap provided between the end faces of the other lamp pinch seal portions 12b and 12b' and the bottom faces of the recesses 21b and 21b' even if the degree of thermal expansion of each lamp differ with each other, it is possible to prevent strain caused by stress between the lamp and the base.

When frequency of lighting, electric power to be applied, a light emitting region, etc. are beforehand set up among two or more lamps in the above case, since, among the two or more lamps, a lamp which reaches the highest temperature of a glass bulb on an average can also be predicted, if the lamp with the highest attainment average temperature of the glass bulb, that is, the lamp with the most thermal expansion of the glass bulb, is fixed to the bases, even if a gap between the base and the pinch seal portion is not formed, it is possible to absorb the expansion of the other lamps.

Therefore, as the lamp fixed to the base, a lamp with the highest attainment average temperature among two or more lamps is preferably selected.

In addition, when the tube diameter, thickness, etc. of the glass bulb differ from each other, a lamp with the highest mechanical strength of a glass bulb is preferably selected as the lamp fixed to the bases from the two or more lamps.

When the base and the lamp with low mechanical strength of the glass bulb are fixed, it difficult to hold the other lamps through the bases. However, it is possible to avoid such a problem according to the present invention.

When each of the two or more lamps has a glass bulb with the same thickness but a different diameter, a glass bulb with a largest diameter is selected as a highest strength glass bulb, and when each of the two or more lamps has a glass bulb with the same diameter but different thickness, a glass bulb with largest thickness is selected as the glass bulb with the highest strength.

In case that the quality of the material of each glass bulb differs but the size of each glass bulb is the same, a glass bulb having the highest strength which depends on the glass bulb material is selected.

This invention is not limited to the embodiments described above, and may be changed suitably depending on use or situation.

For example, a method of fixing the lamp 10a and the bases 20 and 20' is not limited to the method of using adhesion agent, but can be selected appropriately.

For example, by using a platy terminal, the lamp and the bases can be held and fixed between a lamp and the terminal.

In this embodiment, as well as the embodiment described above, as the other lamps, lamps to each of which a feeding member is fixed are used, and a feeding member is inserted in a through hole of each base, and pulled out from the end of the base.

Of course, in these lamps, the feeding member which is pulled out from the end of the base is not limited to a lead wire and can be changed appropriately.

The number of lamps in the lamp device according to this invention is not limited to two, and can be three or more.

According to the present invention, in the lamp device wherein cylindrical or rod-shaped lamps are arranged in a roller body as a heat source, since two or more cylindrical lamps are attached to the bases by fixing one lamp to the bases so that movement in the directions of the expansion/contraction and the tube axis direction of the other lamps is not regulated even if the degree of a temperature rise differ with each glass bulb, it is possible to prevent breakage of the bulb which is attributed to the thermal expansion of the glass bulbs, and it is possible to prevent the complexity of process due to the increase of the number of processes even if there are the large number of the lamps used for one device.

As a result, it is possible to provide a lamp device capable of maintaining high productivity.

Since a lamp with the highest thermal expansion of a glass bulb is selected from the two or more lamps, and fixed with the bases, it is not necessary to provide the gap between the end face of the pinch seal portion and the bottom surface of the recess of the base.

In addition, when a lamp with the highest strength of glass bulb is fixed with the base, it is possible to make the connection of the lamps and the base stable.

Thus the present invention possesses a number of advantages or purposes, and there is no requirement that every claim directed to that invention be limited to encompass all of them.

The lamps according to the present invention may be but not limited to rod-shaped lamps or cylindrical lamps. The lamps can be in any shape.

The disclosure of Japanese Patent Application No. 2003-103569 filed on Apr. 8, 2003 including specification, drawings and claims is incorporated herein by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A lamp device comprising:
   a plurality of lamps which are arranged in parallel to each other, each of the lamps has a glass bulb wherein a pinch seal portion is formed at each end of the glass bulb, an external lead rod extends from the pinch seal portion, and the external lead rod is connected to a feeding member;

bases which connect the plurality of lamps at both ends of the lamp, wherein each of the bases has a through hole in which the pinch seal portion and the feeding member are inserted, and the feeding member is pulled out from an end face of each of the bases, wherein both ends of only one of the lamps are fixed to the bases respectively.

2. The lamp device according to claim 1, wherein the only one of the lamps which is fixed to the bases is a lamp whose glass bulb has the highest heat expansion at an operating time of the lamp device.

3. The lamp device according to claim 1, wherein the only one of the lamps which is fixed to the bases is a lamp whose glass bulb has the highest strength among the plurality of lamps.

4. A lamp device comprising:

a plurality of lamps, each of the lamps has a glass bulb and a lamp end portion at each end of the glass bulb, and insulated bases which connect the plurality of lamps, wherein both ends of only one of the lamps are fixed to the bases respectively.

5. The lamp device according to claim 4, wherein the glass bulb is rod-shaped.

6. The lamp device according to claim 4, wherein the lamp end portion comprises a pinch seal portion, an external lead rod, and feeding member, the pinch seal portion being connected to the external lead rod, and the external lead rod being connected to the feeding member.

7. The lamp device according to claim 6, wherein the pinch seal portion is inserted in a recess.

8. The lamp device according to claim 7, wherein a gap is provided between an end face of the pinch seal portion and a bottom face of the recess.

9. The lamp device according to claim 7, wherein each of the bases has a binding agent injection hole connecting to the recess.

10. The lamp device according to claim 9, wherein the binding agent injection hole is connected to only the recess of the only one of lamps which is fixed to the bases.

11. A heating roller comprising:

a lamp device having a plurality of lamps, each of the lamps has a glass bulb and a lamp end portion at each end of the glass bulb, and insulated bases which connect the plurality of lamps, wherein both ends of only one of the lamps are fixed to the bases respectively.

* * * * *